(12) United States Patent
Tang et al.

(10) Patent No.: US 8,320,149 B2
(45) Date of Patent: Nov. 27, 2012

(54) MULTI-CHIP MODULE WITH MASTER-SLAVE ANALOG SIGNAL TRANSMISSION FUNCTION

(75) Inventors: Chien Fu Tang, Hsinchu (TW); Isaac Y. Chen, Hsinchu County (TW)

(73) Assignee: Richtek Technology Corporation, R.O.C., Hsin-Chu (TW)

( * ) Notice: Subject to any disclaimer, the term of this patent is extended or adjusted under 35 U.S.C. 154(b) by 364 days.

(21) Appl. No.: 12/700,146

(22) Filed: Feb. 4, 2010

(65) Prior Publication Data
US 2011/0187430 A1    Aug. 4, 2011

(51) Int. Cl.
*G11C 5/06* (2006.01)
(52) U.S. Cl. ............ 365/63; 365/189.17; 365/189.011; 365/230.01; 327/202; 327/103
(58) Field of Classification Search .............. 365/63, 365/189.17, 189.011, 230.01; 327/202, 103
See application file for complete search history.

(56) References Cited

U.S. PATENT DOCUMENTS

| | | | | |
|---|---|---|---|---|
| 4,627,030 | A | * | 12/1986 | Barber ........................... 365/154 |
| 2006/0114943 | A1 | * | 6/2006 | Kynast et al. ................. 370/509 |
| 2007/0159262 | A1 | * | 7/2007 | Quan et al. ..................... 331/16 |
| 2009/0195281 | A1 | * | 8/2009 | Tamura et al. ................ 327/163 |

OTHER PUBLICATIONS

Allen et al., CMOS Analog Circuit Design, 1987, Holt, Rinehart and Winston, Inc., all pages and in particular 460-462.*

* cited by examiner

*Primary Examiner* — Fernando Hidalgo
(74) *Attorney, Agent, or Firm* — Tung & Associates

(57) ABSTRACT

The present invention discloses a multi-chip module with master-slave analog signal transmission function. The multi-chip module comprises: a master chip having a first setting input pin for receiving an analog setting signal to generate an analog setting in the master chip, and the master chip duplicating the analog setting to output a first analog output; and a first slave chip for receiving the first analog output from the master chip to generate an internal setting of the first slave chip.

11 Claims, 9 Drawing Sheets

MULTI-CHIP MODULE WITH MASTER-SLAVE ANALOG SIGNAL TRANSMISSION FUNCTION

BACKGROUND OF THE INVENTION

1. Field of Invention

The present invention relates to a multi-chip module with master-slave analog signal transmission function; particularly, it relates to a multi-chip module which transmits analog signals between chips by master-slave architecture to improve signal transmission and to alleviate wire bonding crossing problem. The present invention also relates to a signal conversion circuit and a control circuit in association with the multi-chip module.

2. Description of Related Art

A multi-chip module refers to a system which integrates multiple chips into a single module for higher packaging density, less signal delay, reduced power consumption, and lower cost. Multi-chip module technology is now widely adopted and the applications are very promising.

In a multi-chip module, signal transmission is accomplished by the wires between chips. As it is required to transmit signals among multiple chips and external circuits outside the module, the bonding wires often need to cross over one another, which adversely impacts the yield, as shown in FIG. 1.

In this regard, U.S. Pat. No. 4,627,030 discloses a dual-port memory integrated circuit. This prior art is characterized in that a master chip provides an output signal to more than one slave chip. As shown in FIG. 2, a master chip MASTER receives access requests from input pins EA and EB, and provides control signals to the slave chips SLAVE1 and SLAVE2 via the output pins ESA or ESB. The input pins EA of both slave chips are connected in common to the output pin ESA of the master chip MASTER, and the input pins EB of both slave chips are connected in common to the output pin ESB of the master chip MASTER. The drawback of the prior art is that it is only applicable to transmitting digital control signals, which must be voltage signals, but not capable of transmitting analog signals or current signals.

In view of the foregoing, the present invention provides a multi-chip module with master-slave analog signal transmission function, which not only provides a solution to analog signal transmission, but also solves the bonding wires intercrossing problem in a multi-chip module.

SUMMARY OF THE INVENTION

An objective of the present invention is to provide a multi-chip module with master-slave analog signal transmission function, namely, a multi-chip module which transmits an analog signal between a plurality of chips by master-slave architecture, and the analog signal can be either a current or a voltage signal. The plurality of chips can be coupled in series, in parallel, or partially in series and partially in parallel.

To achieve the objective mentioned above, from one perspective, the present invention provides a multi-chip module with master-slave analog signal transmission function, which comprises: a master chip having a first setting input pin for receiving an analog setting signal to generate an analog setting in the master chip, the master chip duplicating the analog setting to output a first analog output; and a first slave chip for receiving the first analog output from the master chip to generate an internal setting of the first slave chip.

In one embodiment of the aforementioned multi-chip module, the analog setting signal is a voltage signal, and the master chip includes: a voltage-to-current conversion circuit for converting the analog setting signal to a current signal; and a current duplication circuit for duplicating the current signal to generate the first analog output.

In another embodiment, the master chip includes: a voltage-to-current conversion circuit for converting the analog setting signal to a current signal; a current duplication circuit for duplicating the current signal to generate a duplicated current signal; and a current-to-voltage conversion circuit for converting the duplicated current signal to a voltage output signal as the first analog output.

The aforementioned voltage-to-current conversion circuit can be a source follower for example, and the current duplication circuit can be a current mirror for example.

The first slave chip can be the same as or different from the master chip in structure.

The chip module can comprise a plurality of first slave chips coupled in parallel to receive the aforementioned first analog output in common; and it can further comprise a second chip coupled to the first slave chips in series.

In a preferred embodiment, the master chip further includes a first output pin for transmitting the aforementioned first analog output to the first slave chip, and the first setting input pin and the first output pin are located at different sides of the master chip.

The present invention can be applied to a multi-chip module which requires analog signal transmission among chips coupled in series or in parallel.

The objectives, technical details, features, and effects of the present invention will be better understood with regard to the detailed description of the embodiments below.

DESCRIPTION OF THE PREFERRED EMBODIMENTS

Figure 3:
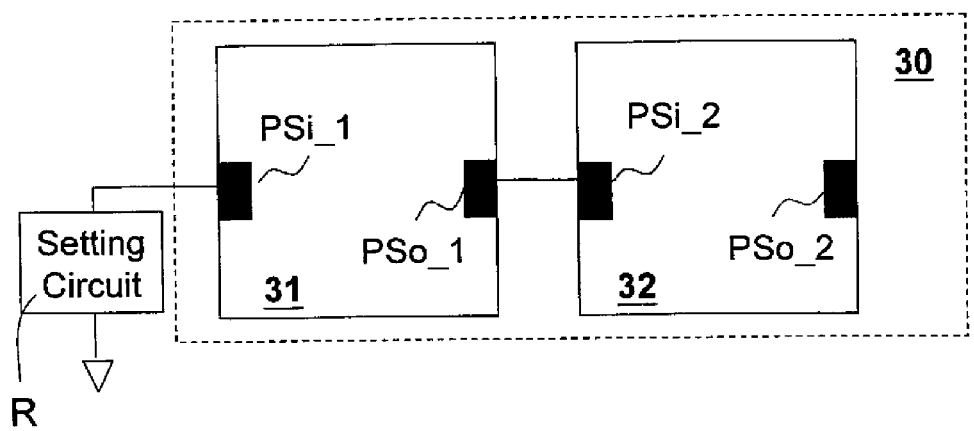
FIG. 3 illustrates an embodiment of the present invention.

Referring to FIG. 3, the present invention provides a multi-chip module 30 with master-slave analog signal transmission function, wherein a master chip 31 receives an analog setting signal and transmits it to a first slave chip 32; the analog setting signal can be provided by a setting circuit R, for example. The master chip 31 has a first input setting pin (PSi_1) for receiving the analog setting signal, and has a first output pin (PSo_1) for transmitting the analog setting signal to the first slave chip 32. For better layout arrangement of multiple chips in the multi-chip module, the first setting pin (PSi_1) and the first output pin (PSo_1) are preferably located at different sides of the master chip 31. The first slave chip 32 has a second setting input pin (PSi_2) for receiving the analog setting signal. In one embodiment of the present invention, the master chip 31 and the first slave chip 32 have essentially the same structure and function, and the first slave chip 32 has a second output pin (PSo_2), such that the master chip 31 and the first slave chip 32 can be manufactured by the same process without a different circuit design. However, certainly, the master chip 31 and the first slave chip 32 can be different circuits; in this case, the first slave chip 32 does not need the second output pin (PSo_2).

Figure 4:
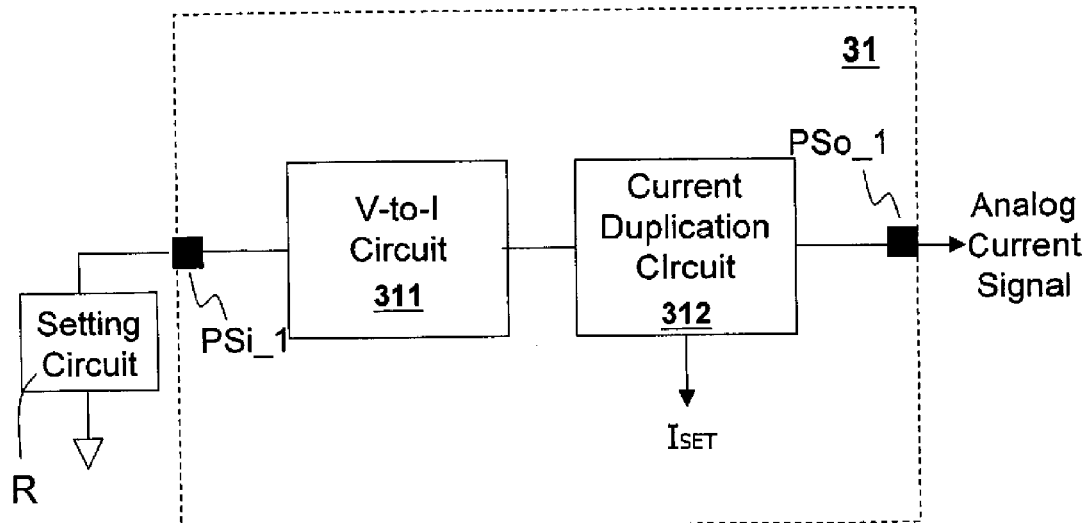
FIG. 4 illustrates an embodiment of the master chip 31.
Figure 5:
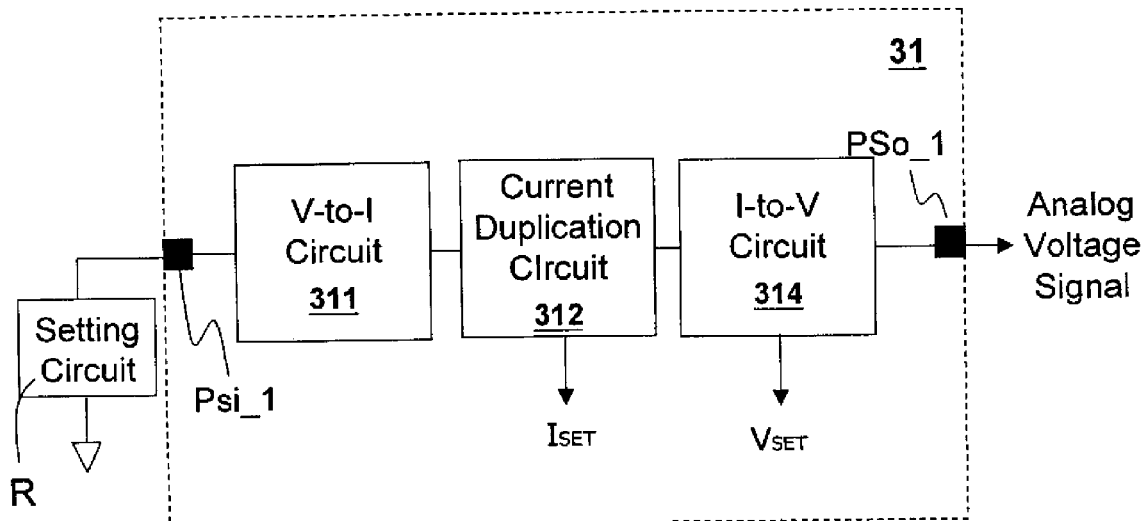
FIG. 5 illustrates another embodiment of the master chip 31.

The internal circuit structure of the master chip 31 for example can be as shown in FIG. 4 or FIG. 5. In the embodiment shown in FIG. 4, the master chip 31 includes a voltage-to-current conversion circuit 311 and a current duplication circuit 312, wherein the analog setting signal from the setting circuit R is converted to a current signal by the voltage-to-current conversion circuit 311, and then the current signal is duplicated by the current duplication circuit 312 to generate a current setting signal ISET, for setting an internal parameter of the master chip 31. The current duplication circuit 312 also duplicates ISET to generate another analog current signal and outputs the duplicated signal from the first output pin (PSo_1).

In the embodiment of the master chip 31 shown in FIG. 5, in addition to the voltage-to-current conversion circuit 311 and the current duplication circuit 312, the master chip 31 further includes a current-to-voltage conversion circuit 314. In this circuit, the analog setting signal from the setting circuit R is converted to a current signal by the voltage-to-current circuit 311, and then the current signal is duplicated by the current duplication circuit 312 to generate a current setting signal ISET; further, the current setting signal ISET is converted to be a voltage setting signal VSET by the current-to-voltage conversion circuit 314, and a corresponding analog voltage signal is outputted from the first output pin (PSo_1). In this embodiment, one or both of the current setting signal ISET and the voltage setting signal VSET can be used for setting an internal parameter(s) of the master chip 31, depending on the requirement of the circuitry in the master chip 31.

Figure 6:
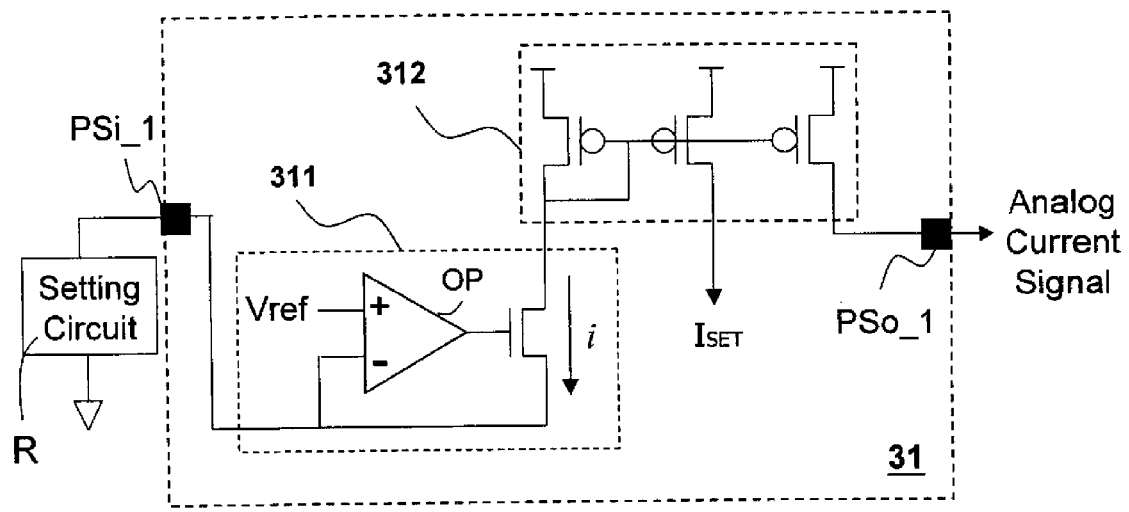
FIG. 6 and FIG. 7 illustrate more detailed embodiments of the circuit in FIG. 4.
Figure 7:
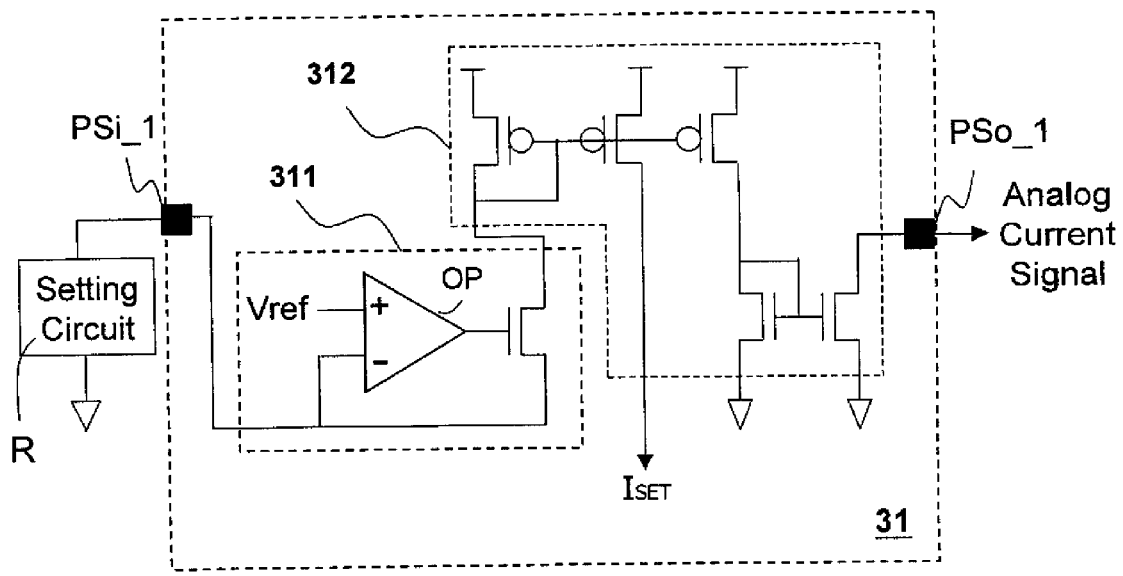

FIG. 6 and FIG. 7 respectively show two embodiments of the circuit in FIG. 4 in more detail. In the embodiment of FIG. 6, the voltage-to-current circuit 311 employs a source follower structure. The setting circuit R for example can be a resistor (assuming having resistance r); thus, the voltage-to-current circuit 311 generates a current i which is equal to Vref/r. The current duplication circuit 312 is a current mirror circuit in this embodiment, which duplicates the current i to generate the analog current setting signal ISET in the master chip 31, and the current duplication circuit 312 also duplicates ISET to generate another analog current signal and outputs it from the first output pin (PSo_1).

In the embodiment of FIG. 7, the current duplication circuit 312 further includes another current mirror circuit for generating a more stable analog current signal output; the other part of the embodiment is similar to the embodiment shown in FIG. 6.

Figure 8:
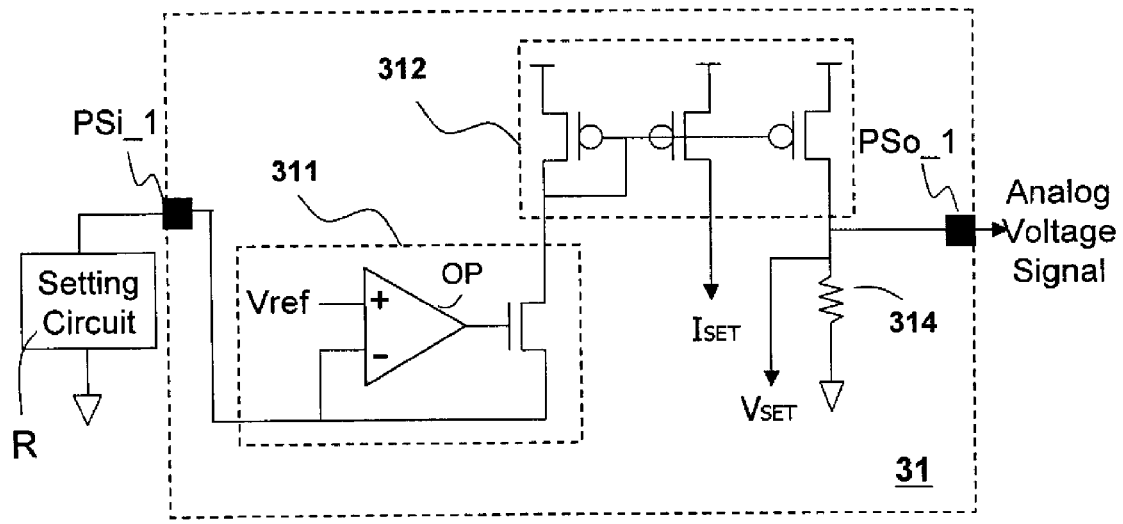
FIG. 8 and FIG. 9 illustrate more detailed embodiments of the circuit in FIG. 5.
Figure 9:
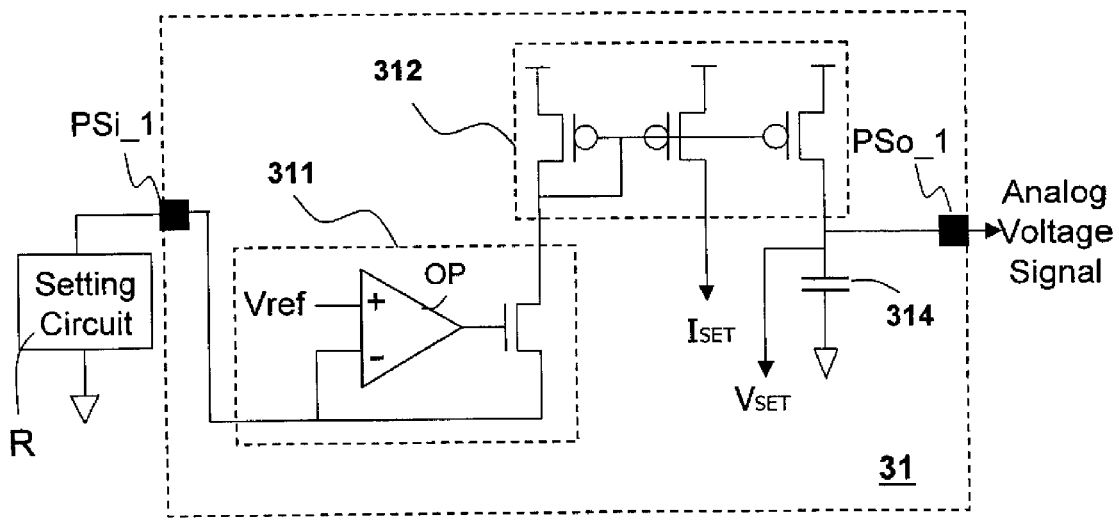
Figure 10:
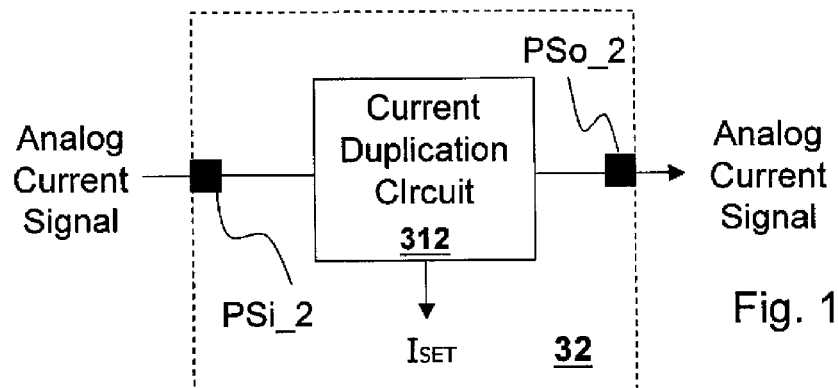
FIGS. 10-13 illustrate several embodiments of the first slave chip 32.
Figure 11:
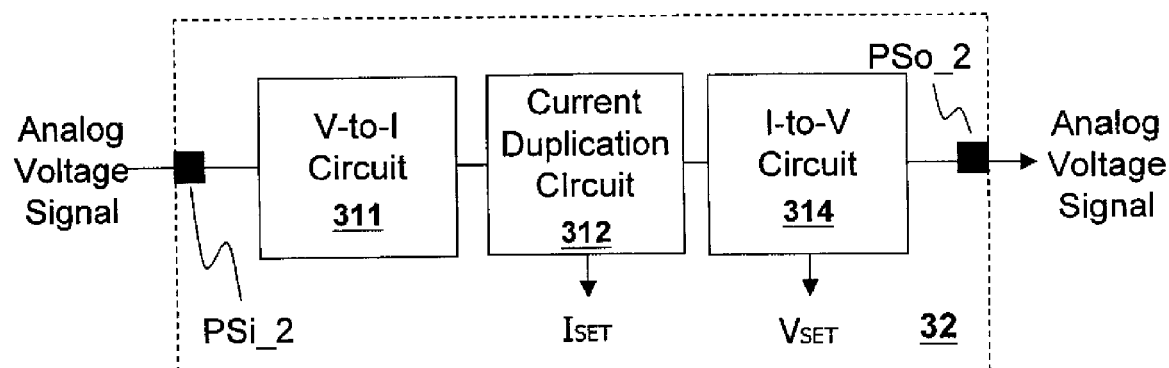
Figure 12:
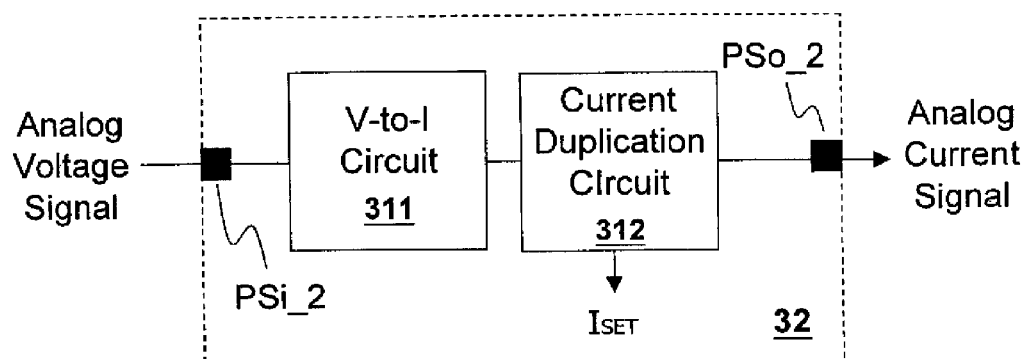
Figure 13:
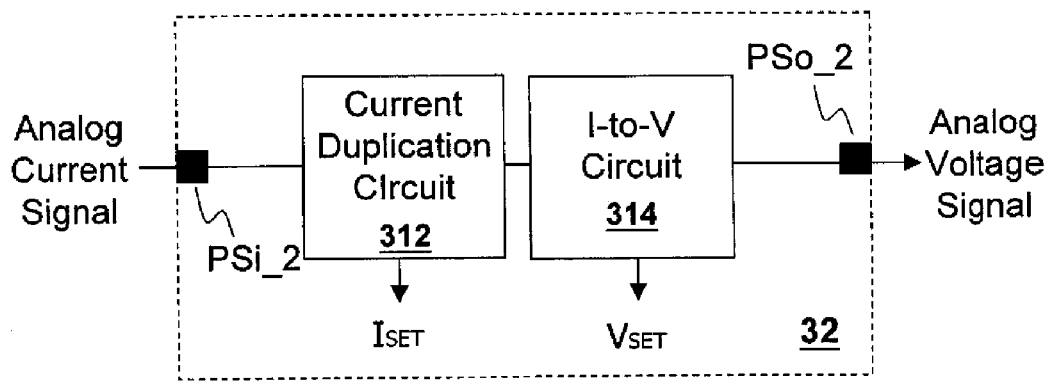

FIG. 8 and FIG. 9 respectively show two embodiments of the circuit in FIG. 5 in more detail, wherein after the current duplication circuit 312 generates a duplicated current signal, the duplicated current signal is converted to a voltage signal by the current-to-voltage circuit 314. The current-to-voltage circuit 314 for example can be a resistor (FIG. 8) or a capacitor (FIG. 9), but is not limited to the two devices. Note that the current duplication circuit 312 in FIG. 8 and FIG. 9 can be replaced by the current duplication circuit 312 in FIG. 7.

The first slave chip 32 can have the same or different circuit structure as/from the master chip 31, depending on whether the output of the master chip 31 is an analog current signal or an analog voltage signal. The first slave chip 32 for example can be anyone of the structures shown in FIGS. 10-13.

Figure 14:
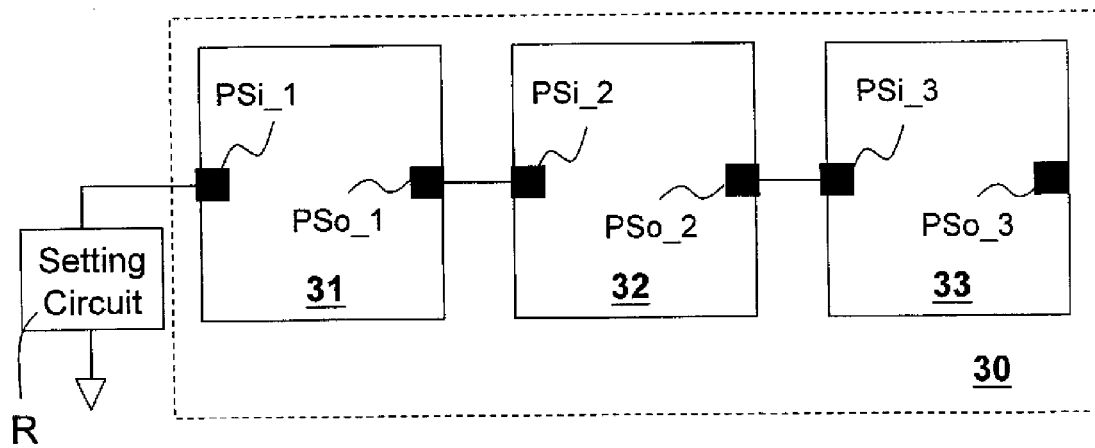
FIGS. 14-16 illustrate several more embodiments of the present invention.
Figure 15:
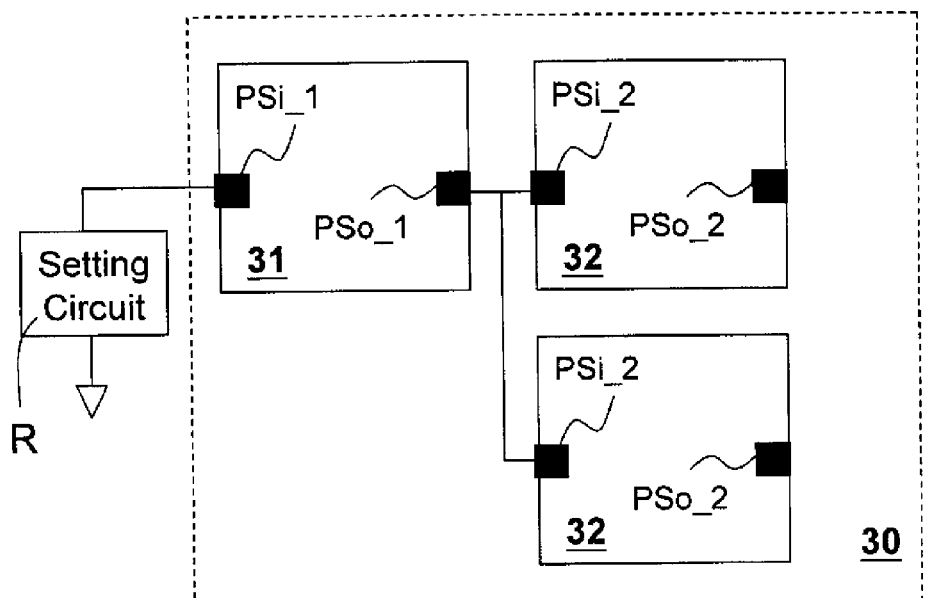
Figure 16:
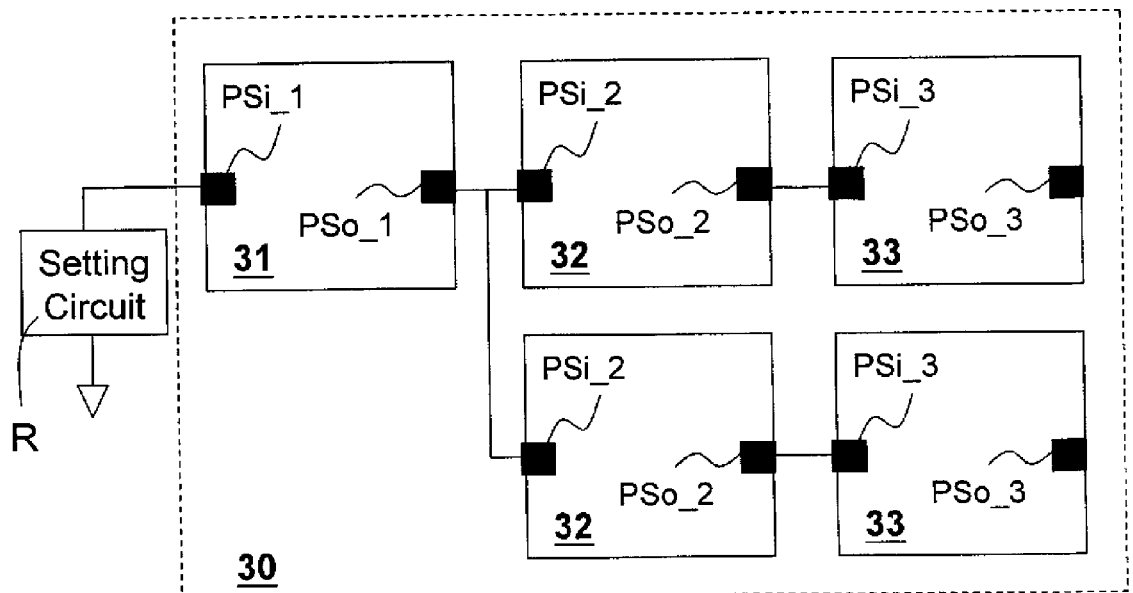

Under the concept of the present invention, the multi-chip module is not limited to comprising only one master chip and a slave chip. Instead, the multi-chip module can comprise multiple chips coupled in series or in parallel. For example, referring to FIG. 14, in addition to the master chip 31 and the first slave chip 32, a second slave chip 33 can be coupled to the first slave chip 32 in series. The second slave chip 33 can be the same structure as the first slave chip 32. As shown in FIG. 15 and FIG. 16, multiple first slave chips 32 can be coupled to the master chip 31 in parallel, and multiple second slave chip 33 can be coupled to the first slave chip 32 in series (or even in parallel, not shown).

Figure 1:
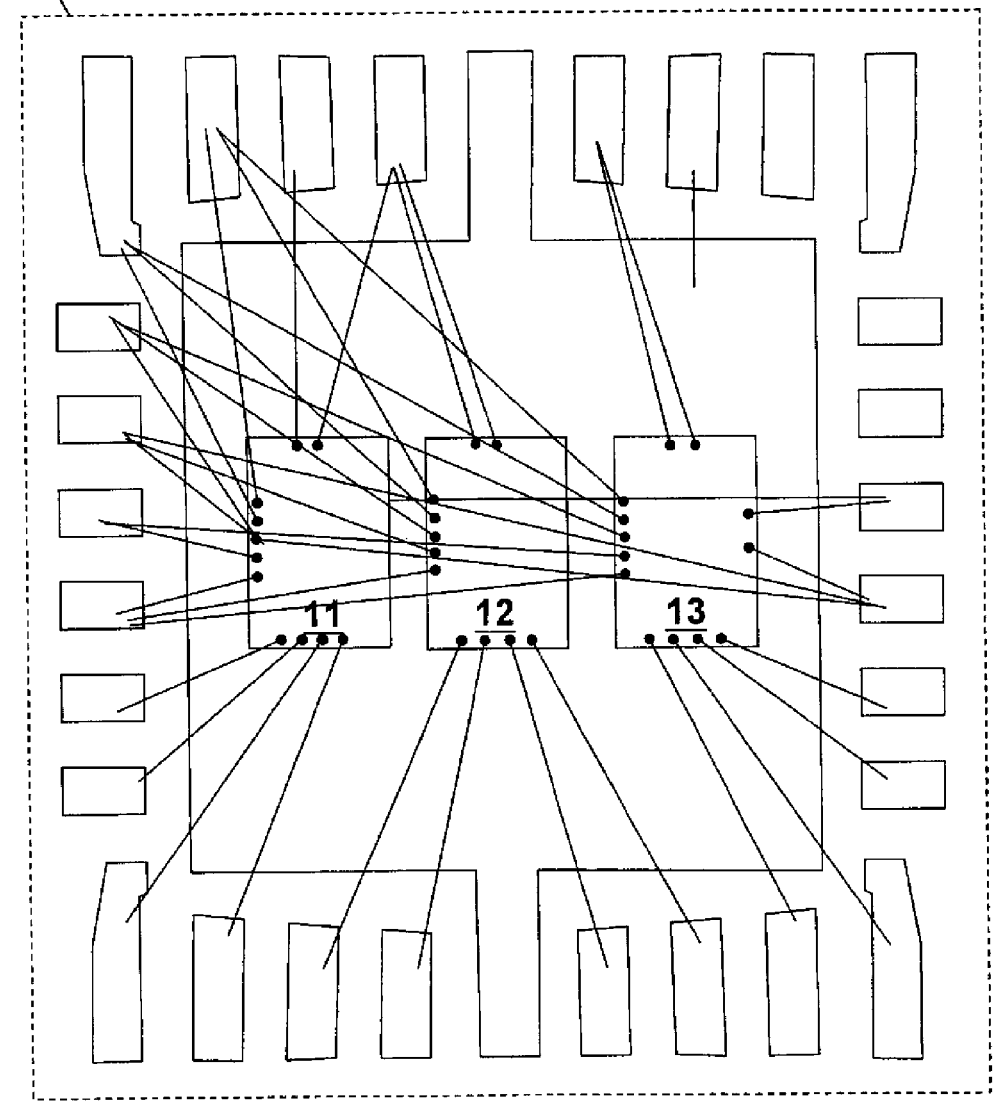
FIG. 1 illustrates the bonding wires intercrossing problem in prior art.
Figure 2:
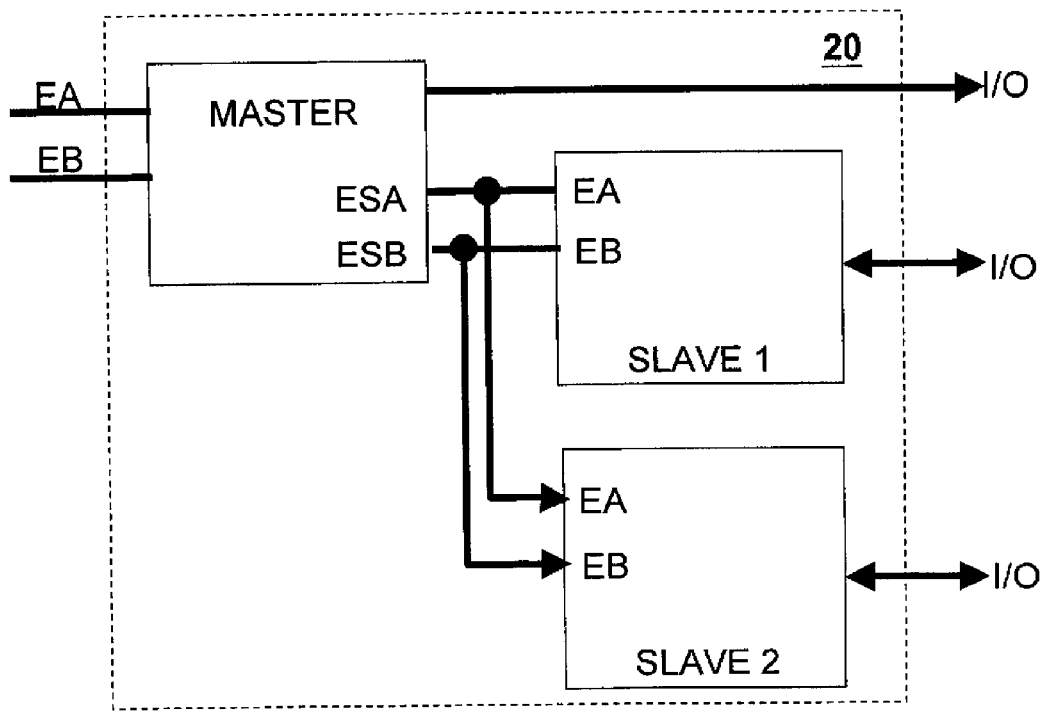
FIG. 2 illustrates the circuit structure of the U.S. Pat. No. 4,627,030.
Figure 17:
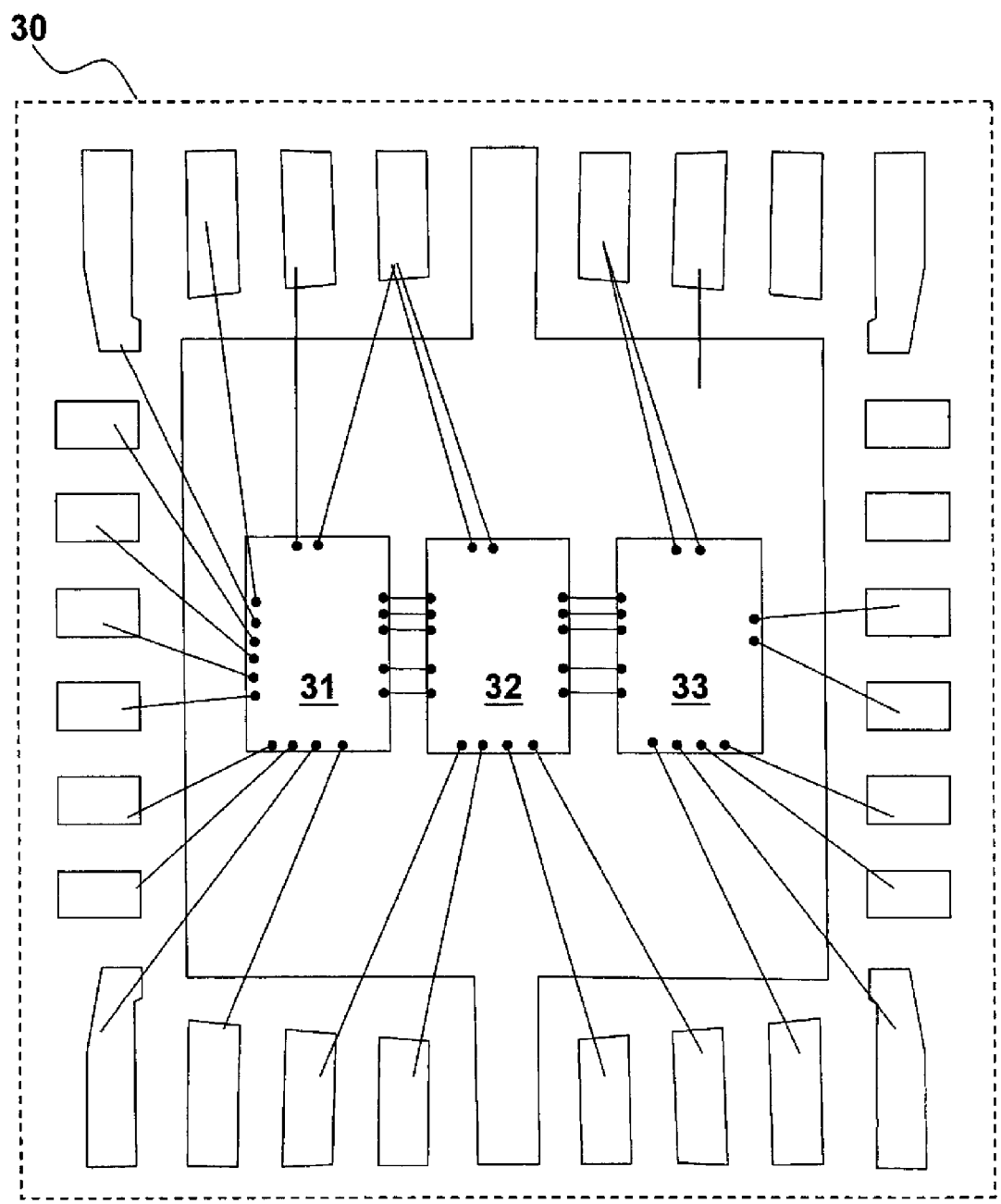
FIG. 17 shows that the present invention improves the bonding wires intercrossing problem in a multi-chip module.

FIG. 17 shows the result of a multi-chip module applying the present invention. Compared with the prior art shown in FIG. 1, the present invention apparently solves the bonding wires intercrossing problem in the prior art.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the voltage-to-current circuit 311, the current duplication circuit 312, and the current-to-voltage circuit 314 etc., are not limited to the embodiments shown in FIGS. 6-9. In view of the foregoing, the spirit of the present invention should cover all such and other modifications and variations, which should be interpreted to fall within the scope of the following claims and their equivalents.

What is claimed is:

1. A multi-chip module with master-slave analog signal transmission function, comprising:
    a master chip having a first setting input pin for receiving an analog setting signal to generate an analog setting in the master chip, the master chip duplicating the analog setting to output a first analog output; and a first slave chip for receiving the first analog output from the master chip to generate an internal setting of the first slave chip, wherein the analog setting signal is a voltage signal, and wherein the master chip includes:
    a voltage-to-current conversion circuit for converting the analog setting signal to a current signal; and
    a current duplication circuit for duplicating the current signal to generate the first analog output.

2. The multi-chip module of claim 1, wherein the voltage-to-current conversion circuit includes a source follower.

3. The multi-chip module of claim 1, wherein the current duplicating circuit duplicates the current signal to generate a duplicated current signal; and the master chip further includes a current-to-voltage conversion circuit for converting the duplicated current signal to a voltage output signal as the first analog output.

4. The multi-chip module of claim 3, wherein the voltage-to-current conversion circuit includes a source follower.

5. The multi-chip module of claim 1, wherein the master chip further includes a first output pin for transmitting the first analog output to the first slave chip, and the first setting input pin and the first output pin are located at different sides of the master chip.

6. The multi-chip module of claim 1, further comprising:
    a second slave chip coupled to the first slave chip in series, wherein the first slave chip duplicates the first analog output from the master chip to generate a second analog output and transmits the second analog output to the second slave chip.

7. The multi-chip module of claim 1, comprising at least two first slave chips including the first slave chip recited in claim 1, the at least two first slave chips being coupled in parallel and both receiving the first analog output from the master chip.

8. The multi-chip module of claim 1, wherein the first slave chip includes:
a current duplication circuit for duplicating the first analog output to generate a duplicated current signal.

9. The multi-chip module of claim 8, wherein the first slave chip further includes:
a current-to-voltage conversion circuit for converting the duplicated current signal to a voltage signal.

10. The multi-chip module of claim 1, wherein the first slave chip includes:
a voltage-to-current conversion circuit for converting the first analog output to a current signal; and
a current duplication circuit for duplicating the current signal to generate a duplicated current signal.

11. The multi-chip module of claim 10, wherein the first slave chip further includes:
a current-to-voltage conversion circuit for converting the duplicated current signal to a voltage signal.

* * * * *